(12) United States Patent
Chinn et al.

(10) Patent No.: US 6,936,183 B2
(45) Date of Patent: Aug. 30, 2005

(54) ETCH PROCESS FOR ETCHING MICROSTRUCTURES

(75) Inventors: Jeffrey D. Chinn, Foster City, CA (US); Sofiane Soukane, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 418 days.

(21) Appl. No.: 10/265,598

(22) Filed: Oct. 8, 2002

(65) Prior Publication Data

US 2003/0071015 A1 Apr. 17, 2003

Related U.S. Application Data

(60) Provisional application No. 60/344,497, filed on Oct. 17, 2001.

(51) Int. Cl.$^7$ .............................................. C03C 15/00

(52) U.S. Cl. .............................. 216/90; 216/91; 216/99; 216/103; 216/107

(58) Field of Search .............................. 216/90, 91, 99, 216/103, 107; 438/756

(56) References Cited

U.S. PATENT DOCUMENTS

| | | | | |
|---|---|---|---|---|
| 4,749,440 A | | 6/1988 | Blackwood et al. | 156/646 |
| 5,022,961 A | | 6/1991 | Izumi et al. | 156/646 |
| 5,352,324 A | | 10/1994 | Gotoh et al. | 156/643 |
| 5,352,327 A | | 10/1994 | Witowski | 156/646 |
| 5,439,553 A | | 8/1995 | Grant et al. | 216/58 |
| 6,043,162 A | | 3/2000 | Shimizu et al. | 438/706 |
| 6,126,847 A | * | 10/2000 | Thakur et al. | 216/57 |
| 6,238,580 B1 | * | 5/2001 | Cole et al. | 216/2 |
| 6,331,257 B1 | * | 12/2001 | Loo et al. | 216/13 |
| 6,527,762 B1 | * | 3/2003 | Santini et al. | 604/890.1 |
| 6,806,205 B2 | * | 10/2004 | Jang et al. | 438/745 |

OTHER PUBLICATIONS

Alley, et al., "The Effect of Release–Etch Processing on Surface Microstructure Stiction," Solid–State Sensor and Actuator Workshop, 1992 5$^{th}$ Technical Digest, IEEE, 202–207.

Anguita, et al., "HF/H$_2$O vapor etching of SiO$_2$ sacrificial layer for large–area surface–micromachined membranes," Sensors and Actuators A 64, 1998, 247–251.

Jang, et al., "Silicon Surface Micromachining by Anhydrous HF Gas–Phase Etching with Methanol," SPIE 3511, 1998, 143–150.

Copy of International Search Report dated Dec. 19, 2003 from corresponding PCT application, PCT/US02/29853, provided as a concise explanation of relevance for Reference #B1.

(Continued)

Primary Examiner—Nadine G. Norton
Assistant Examiner—Binh X. Tran
(74) Attorney, Agent, or Firm—Moser, Patterson & Sheridan, LLP

(57) ABSTRACT

A two-step method of releasing microelectromechanical devices from a substrate is disclosed. The first step comprises isotropically etching a silicon oxide layer sandwiched between two silicon-containing layers with a gaseous hydrogen fluoride-water mixture, the overlying silicon layer to be separated from the underlying silicon layer or substrate for a time sufficient to form an opening but not to release the overlying layer, and the second step comprises adding a drying agent to substitute for moisture remaining in the opening and to dissolve away any residues in the opening that can cause stiction.

8 Claims, 2 Drawing Sheets

OTHER PUBLICATIONS

S.L.Luke Chang et al, "Anhydrous HF etch reduces processing steps for DRAM capacitors", Solid State Tecjnology, May 1998, pp. 71–76.

A. Witvrouw et al, "A comparison between wet HF etching and vapor HF etching for sacrificial oxide removal", Proceedings SPIE vol. 4174 (2000) pp 130–141.

Rai–Choudhury, MEMS & MOEMS, SPIE2000, pp. 175;180; 344–346; 457; 460–463.

Jong H Lee et al, "Gas–Phase Etching of Sacrificial Oxides using Anhydrous HF and Ch3OH", 10thAnnual Internatl Workshop on MEMS, IEEE, Jan. 26–30, 1997.

Yong–Il Lee et al, "Dry Release for Surface Micromachining with HF Vapor–Phase Etching", J. Microelectromechanical Systems, vol. 6, No. 3, Sep. 1997, pp 226–233.

* cited by examiner

ETCH PROCESS FOR ETCHING MICROSTRUCTURES

This application claims the priority of Provisional Application No. 60/344,497 filed Oct. 17, 2001.

This invention relates to a method of releasing microelectromechanical devices from a substrate using a gaseous etchant. More particularly, this invention relates to a method of releasing silicon-containing devices using a two-step method.

BACKGROUND OF THE INVENTION

Microelectromechanical systems (hereinafter MEMS) require controllable, partial separation of device parts from a substrate. Compliant silicon-containing microstructures are etched so as to completely release them from an underlying silicon-containing substrate. For example, an intermediate silicon oxide layer is etched to separate at least a portion of a silicon-containing layer from a substrate.

A simple MEMS device is shown in FIG. 1. A device part, or beam 10, is partially isotropically etched from a substrate 12, leaving a support or connector 14 between them, that allows the part 10 to move, e.g., up and down, with respect to the substrate 12.

The etchant of choice heretofore for isotropically etching silicon oxide is aqueous hydrogen fluoride (HF).

A major problem with processing such parts is that as etching proceeds, adherent residues form as by-products on the substrate, and capillary, van der Walls and electrostatic attraction between the etched part 10 and the substrate 12 causes collapse of the part 10. In effect the beam 10 of FIG. 1 under this attraction bends down toward the substrate, and sticks to it, generally permanently. This phenomenon is known as stiction. In addition, etch by-products and contaminants in rinse waters also precipitate out of solution during drying steps, and cause adhesion bonding between the device part and the substrate that is even stronger than the electrostatic bonding, and interferes or prevents release of the final structure from the substrate.

Several ways of minimizing stiction have been proposed, including wet etching with HF, rinsing the residues away with a solvent, and drying the parts with a liquid that has no or little surface tension, such as supercritical carbon dioxide. An alternative etch is anhydrous HF, which does not leave residues. However, because it is a very strong acid, special equipment is required to handle it.

Since other steps in the formation of MEMS devices use dry, rather than wet methods, and large multichamber units can be used to transfer a substrate from one processing step to another without requiring that the substrate be exposed to the atmosphere, it is undesirable to mix wet and dry processes when forming such devices. The use of rinse solvents to remove moisture from a microstructure causes as many problems as it solves; the use of supercritical carbon dioxide requires a complex and difficult setup, and thus adds to the expense of manufacture.

The possibility then, of using anhydrous HF as the etchant, appears to be advantageous because it is easy to implement in a multi-chamber processor, it is an efficient, isotropic etch for silicon oxides, and it does not require mixing wet and dry processing. However, the etch rate is lower than when using aqueous HF. Further, anhydrous HF is a very powerful etchant, and can etch the materials used for making the processing chambers as well as the substrate to be etched. Thus damage to the processing chamber occurs which must be repaired, adding to the cost of manufacture.

Generally, semiconductor processes using semiconductor materials, particularly silicon and silicon oxide, are used to make MEMS devices. Because of their varying water content, doped silicon oxides, which have a high moisture content, etch faster than undoped oxides.

When an anhydrous HF etch is used to etch a silicon oxide, the amount of water present can vary depending on the water content of the silicon oxide to be etched away. Doped silicon oxides, which are hygroscopic, absorb water from the atmosphere to form internal hydroxyl groups, and thus have a high water content. Dense silicon oxides, such as thermal, undoped thermally densified TEOS and high temperatures oxides, have a lower moisture content because their water absorption is limited to the surface layer of the oxide. However, as will be further explained below, since water initiates and promotes the etch reaction between HF and silicon oxides, the presence of some water is necessary to maintain an adequate etch rate.

The overall etch reaction is $$4HF + SiO_2 \rightarrow SiF_4 + 2H_2O$$

Thus water molecules are formed on the surface of the oxide during the etch step. High water content silicon oxides initiate the etch reaction rapidly and come to a steady etch rate rapidly as well. On the other hand, the etch rate of low water content silicon oxides begins slowly, i.e., there is an initiation period, and the etch rate thus increases over time. However, overall the etch rate of these oxides remains low.

Other reactions between HF and silicon oxides are also possible:

$$6HF + SiO_2 \rightarrow H_2SiF_6 + 2H_2O \qquad 2)$$

The silicon fluoride compound can decompose to form either silicon tetrafluoride, as $$H_2SiF_6 \rightarrow 2HF + SiF_4, \qquad 3)$$

which does not leave a residue, and wherein the reaction products are in the gaseous phase; or to form a silicate and more HF, as $$2H_2SiF_6 + 3H_2O \rightarrow H_3SiO_3 + 6HF. \qquad 4)$$

This latter reaction does leave a residue which can cause stiction. Thus this reaction should be avoided to prevent deposits on the surface of the structure or feature being formed.

Further, the initial etching reaction also leaves a residue, and thus a rinse is necessary at completion of the anhydrous HF etch to remove the residue; this etch then is difficult to integrate into a multichamber or cluster tool that otherwise uses dry processes.

In efforts to solve the stiction problems, it has also been suggested to use anhydrous HF alone; but since water initiates the etch reaction, particularly for thermal oxides with a low moisture content, the etch rate for anhydrous HF alone is low. Etching with anhydrous HF can take up to 10 hours to form complex microstructures.

The addition of methanol to anhydrous HF as a substitute for water has been suggested. This would be advantageous because capillary forces are reduced, and no residue is observed on some oxides when methanol is used. However, again, the etch rate is low initially until sufficient water is generated in the reaction, which leads to a low yield; further, the unknown initiation time hinders determination of the time required for release.

The addition of acetic acid to anhydrous HF also has been suggested as a catalyst for the etch reaction with anhydrous HF, since acetic acid repels water vapor. However, the etch rate here is low as well.

Thus using anhydrous HF as the etchant results in a dry, isotropic, non-plasma etch method that does not leave a residue on the etched surface, that does not cause stiction, and that can be used in a cluster tool. However, the etch rate is too low for commercial applications.

Prior art workers have tried a combination of anhydrous HF and methanol, using an etch chamber of aluminum coated with tetrafluoroethylene. A mass flow controller regulated the flow rate of anhydrous HF and a mass spectrometer regulated the flow rate of methanol in a nitrogen carrier gas. Polysilicon cantilevers having a thickness of 2 microns, a width of 10 microns, a length of 1000 microns and a gap between the polysilicon and the substrate of 2 microns, were fabricated without stiction. The detachment length is much higher than when conventional wet release etching is performed. The etch rate however can only be estimated, at about 10–15 microns/hr at an HF partial pressure of 15 torr and a methanol partial pressure of 4.5 torr. Thus the etch rate remains low, and about 100 hours was required to etch a cantilever beam about 1000 microns long.

Thus the problem remains that by using anhydrous HF, the total time needed for release of a microstructure is long, and the etch rate cannot be known with certainty because it depends on the type of silicon oxide employed and the amount of water generated in the reaction.

An improved and more reliable method of releasing a feature from a MEM device has thus been sought that will maintain high etch rates.

SUMMARY OF THE INVENTION

The process of the invention comprises two steps that can be cycled.

The first step uses a gaseous HF-$H_2O$ etchant mixture to etch a silicon oxide to form an opening between two silicon-containing layers. This step is continued for that amount of time sufficient to form structures that will not collapse during a subsequent drying step, but one that does not completely release the structure either. This first step does produce a residue however, as an excess of water is used to increase the etch rate of the silicon oxide to an acceptable level. Thus the timing for this first step is chosen to be such that the amount of etching is limited to that length of a device that cannot contact the underlying substrate during a subsequent step. Thus stiction is avoided by limiting the amount of etching that occurs during this first step.

In the second step, a second solvent or drying agent is added, one that will repel or substitute for the water present in the opening during the first step. Thus the second solvent substitutes and displaces the water remaining in the opening under conditions that vaporize the moisture. The second solvent also must be able to dissolve the residue produced by the etching reaction, thereby preventing future stiction problems. These two steps can be repeated or cycled until the desired features are formed and released.

DETAILED DESCRIPTION OF THE INVENTION

FIGS. 2–5 illustrate the steps of the present process.

Figure 1:
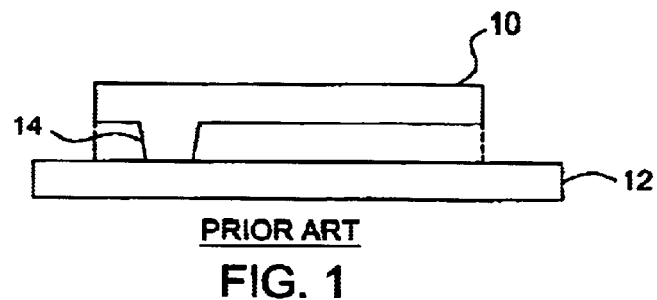
FIG. 1 is a cross sectional view of a simple MEM device.
Figure 2:
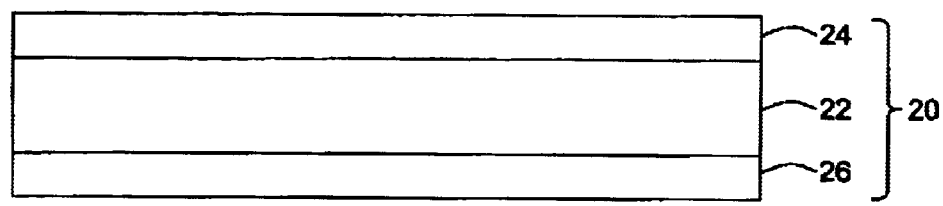
FIG. 2 is a cross sectional view of a simple trilayer substrate to be processed in accordance with the invention.

Referring to FIG. 2, a simple substrate 20 for making a MEM device is shown comprising a sacrificial silicon oxide layer 22 between two silicon-containing layers 24 and 26. Suitable silicon-containing materials can include polysilicon, crystalline silicon, doped silicon, a silicon wafer, and the like. The two layers 24 and 26 can be the same or different.

Various methods are well known to deposit various silicon oxides on a silicon-containing substrate. For example, silicon oxide can be deposited by chemical vapor deposition (CVD); by plasma-enhanced chemical vapor deposition (PECVD); by high temperature chemical vapor deposition (HTO); by low pressure chemical vapor deposition (LPCVD) and the like. Suitable silicon oxides can be deposited from silane or tetraethoxysilane. The silicon oxides can be variously doped or can be undoped. Typical useful silicon oxides include phosphosilicate glass (PSG); borophosphosilicate glass (BPSG); silicon oxide deposited from tetraethoxysilane (TEOS), including dopants such as boron and phosphorus; and can be hygroscopic or dense. Differently doped or made silicon oxides vary as to the amount of moisture absorbed or adsorbed on their surface.

Figure 3:
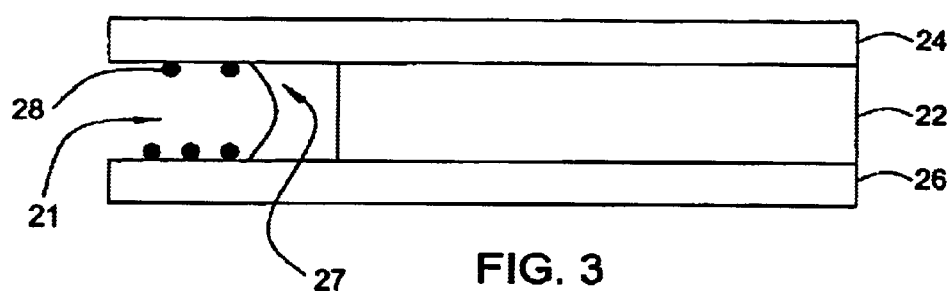
FIG. 3 is a cross sectional view of a substrate after performing step 1 of the present process.

In a first step of the present process, as shown in FIG. 3, the oxide layer 22 is partially etched away with a water-HF mixture for a first timed interval to form an opening 21, in which some of the silicon oxide layer 22 is removed, leaving some aqueous solution 27 and a residue 28 in the opening 21. This timed interval only partially releases the MEM device.

The addition of excess water for the reaction increases the etch rate of the initial step, so that the amount of moisture in the oxide to be etched becomes immaterial. About 1–10% by weight of HF of water can be added, preferably from 1–5% by weight of the HF.

Figure 4:
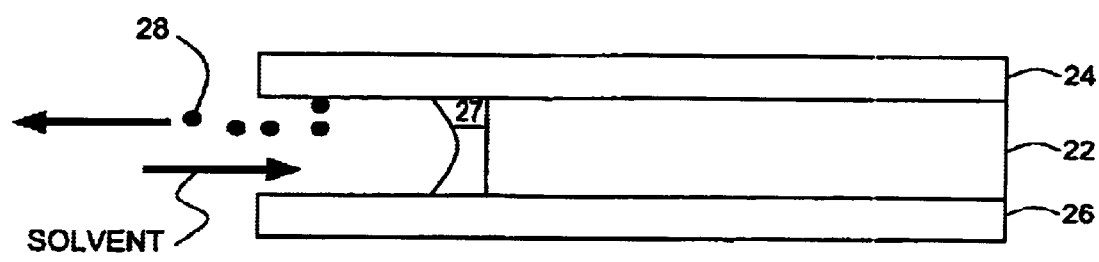
FIG. 4 is a cross sectional view of a substrate while performing step 2 of the present process.

In the second step of the present process, as shown in FIG. 4, a drying agent is added to the etchant. Suitable drying agents are polar solvents, and include methanol, ethanol, isopropyl alcohol, acetic acid and the like. The drying agent is added both to remove or substitute for the water on the surface of the etched oxide, and to dissolve and rinse away the residue 28 produced in the first step that causes stiction.

The polar drying agent dissolves and removes the residue 28, and, as shown by the arrows, replaces the water 27 present initially. Thus the drying agent acts to dissolve the residue, to at least partially replace the water present, and thus to dry the opening 21.

Figure 5:
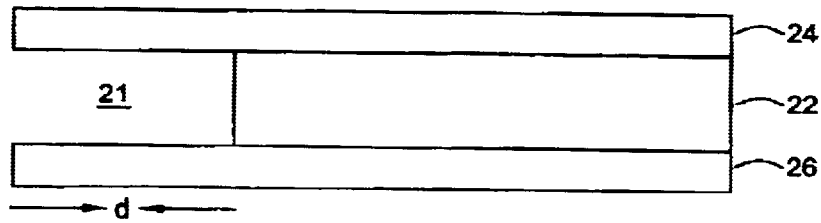
FIG. 5 is a cross sectional view of a partially released substrate after performing step 2 of the present process.

FIG. 5 is a cross sectional view of the substrate at the end of step 2 of the present process. A partial opening 21 having a length "d" has been made in the silicon oxide layer 22, which opening is now dry and residue-free.

By cycling these two steps, the oxide etch rate remains high due to the water present initially, and the residue which causes stiction is continually removed. The growing opening is also repeatedly dried with the polar solvent to prevent moisture buildup in the opening. The oxide layer 22 is thus removed using a non-plasma process wherein water is continually removed so that the present process can be integrated into a cluster tool used to form the structures, and to release them from the substrate.

The above two steps can be repeated or cycled as needed to etch away sufficient oxide for full release of the desired device part.

The above two-step process can be carried out in an apparatus as described below in FIG. 6.

Figure 6:
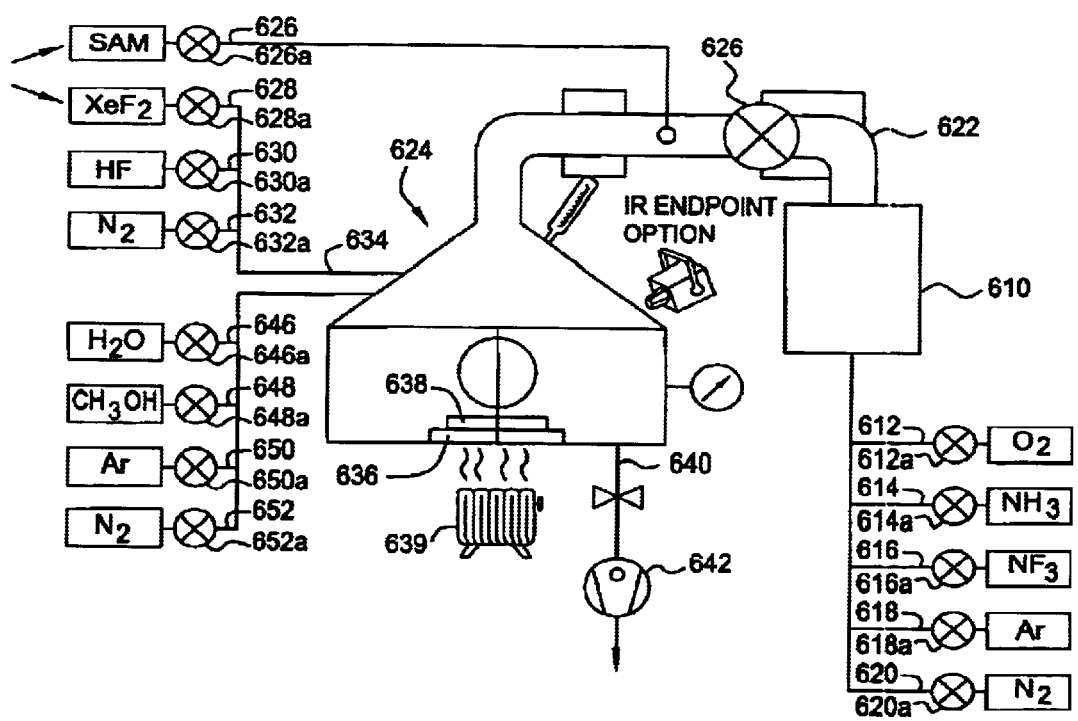
FIG. 6 is a schematic cross sectional view of a chamber suitable for carrying out the inventive steps.

Referring to FIG. 6, a remote plasma source chamber 610 is commercially available. A plurality of gas sources are connected to suitable lines 612, 614, 616, 618 and 620 to feed one or more gases such as oxygen, ammonia, nitrogen trifluoride, argon and nitrogen, as examples, through valves 612a, 614a, 616a, 618a, and 620a respectively. Such plasma precursor gases can be used to clean or ash residues that build up in the main chamber 624. The plasma is then fed through a line 622 into an etch chamber 624. A valve 626 adjusts the pressure in the remote plasma chamber 610 and passes plasma to the chamber 624.

A plurality of gas lines 626, 628, 630, 632, 646, 648, 650 and 652, supply various etch and reaction gases to the chamber 624 through lines 634 and 635 using valves 626a, 628a, 630a, 632a, 646a, 648a, 650a and 652a respectively.

The chamber 624 includes a mount 636 for the substrate to be etched 638. The mount 636 is connected to a temperature control means 639, which can be a resistance heater as shown, that maintains the temperature of the substrate generally between about 10 and 40° C. during the etch reaction. The temperature control means 639 can also be an array of lamps, or a water cooled jacket. The chamber 624 is suitably maintained at about room temperature during the etch. However, the temperature can be elevated somewhat to ensure that moisture is removed from the substrate 638, but without bringing the drying agent to the boiling point. Temperatures that will condense the drying agent are to be avoided as well. The drying agent should remain in the liquid phase to dissolve the residues that cause stiction, and the HF-water mixture should be in the gaseous phase during the reaction.

An exhaust line 640 maintains a suitable pressure in the chamber 624 by means of a valve 642.

Separate gas lines are required in some instances to avoid reactions in the gas lines, rather than in the chamber 624, as for example, a reaction between xenon difluoride and water.

In order to reduce damage to the chamber interior walls and fixtures caused by the use of anhydrous HF, a layer of nickel can be applied to those lines and surfaces that come in contact with HF.

The chamber 624 is also capable of depositing a passivation layer over the etched feature to protect it and to prevent stiction during or after etching.

Additional lines and valves can be provided as needed for other process steps, such as cleaning the chambers or depositing a protective film over the released part in known manner.

The invention will be further described in the following example, but the invention is not meant to be limited by the details set forth therein.

EXAMPLE

A layer of silicon dioxide deposited over a silicon layer and in turn having a polysilicon layer to be released deposited thereon, was etched using a mixture of 1.0 standard liters per minute (slm) of 5% by weight aqueous HF at a pressure of 100 millitorr and a temperature of about 40° C. to form a small opening in the silicon oxide layer. About 33 ml of liquid methanol were then added to the opening to dissolve any residue and rinse the opening.

The resultant opening was free of residues and methanol had replaced much of the water generated during etching.

These etch and rinse steps were repeated to form the desired device.

Although the invention has been described in terms of particular materials, other materials used to make MEMS devices can be substituted, and other reaction conditions and processing equipment can be substituted, as will be known to those skilled in the art. Thus the invention is meant to be limited only by the scope of the claims appended hereto.

We claim:

1. A method of releasing a microelectromechanical structure comprising a silicon oxide layer sandwiched between two silicon-containing layers, a first, substrate layer and a second, overlying layer to be released from the silicon oxide layer comprising, in sequence,
   a) isotropically etching a partial opening in the silicon oxide layer using a gaseous aqueous hydrogen fluoride etchant; and
   b) adding a polar drying agent to replace moisture remaining in the partial opening, and dissolve away residues remaining therein.

2. A method according to claim 1 wherein steps a) and b) are repeated.

3. A method according to claim 1 wherein steps a) and b) are cycled until complete release of the structure is achieved.

4. A method according to claim 1 wherein the initial isotropic etch is continued for a time period that only partially removes the silicon oxide layer such that the second layer cannot touch the substrate layer and adhere to it.

5. A method according to claim 1 wherein from about 1 to 10% by weight of HF in water is added.

6. A method according to claim 1 wherein the drying agent is methanol.

7. A method according to claim 1 wherein the drying agent is acetic acid.

8. A method of forming a microelectromechanical feature comprising
   a) isotropically etching a silicon oxide layer between two silicon-containing layers with gaseous aqueous hydrogen fluoride for a time period that provides an opening in the silicon oxide layer, but that does not allow the overlying silicon layer to collapse onto and adhere to the underlying silicon-containing layer; and
   b) adding a quantity of a drying agent so as to substitute the drying agent for water remaining in the opening and to dissolve residues remaining in the opening; and
   c) repeating steps a) and b) until complete release of the feature to be made is achieved.

* * * * *

UNITED STATES PATENT AND TRADEMARK OFFICE
CERTIFICATE OF CORRECTION

PATENT NO. : 6,936,183 B2
DATED : August 30, 2005
INVENTOR(S) : Chinn et al.

It is certified that error appears in the above-identified patent and that said Letters Patent is hereby corrected as shown below:

<u>Title page,</u>
Item [56], References Cited, OTHER PUBLICATIONS,
"Alley, et al.," reference, after "1992" insert -- , --.

Signed and Sealed this

Twenty-fourth Day of January, 2006

JON W. DUDAS
*Director of the United States Patent and Trademark Office*